(12) United States Patent
Weyers et al.

(10) Patent No.: US 9,008,145 B2
(45) Date of Patent: Apr. 14, 2015

(54) SYSTEM FOR FREQUENCY CONVERSION, SEMICONDUCTING DEVICE AND METHOD FOR OPERATING AND MANUFACTURING THE SAME

(71) Applicant: Forschungsverbund Berlin e.V., Berlin (DE)

(72) Inventors: Markus Weyers, Wildau (DE); Götz Erbert, Löbau (DE)

(73) Assignee: Forschungsverbund Berlin e.V., Berlin (DE)

( * ) Notice: Subject to any disclaimer, the term of this patent is extended or adjusted under 35 U.S.C. 154(b) by 108 days.

(21) Appl. No.: 13/859,832

(22) Filed: Apr. 10, 2013

(65) Prior Publication Data

US 2013/0270518 A1 Oct. 17, 2013

(30) Foreign Application Priority Data

Apr. 11, 2012 (DE) .......................... 10 2012 205 834

(51) Int. Cl.
*H01S 3/093* (2006.01)
*H01L 33/06* (2010.01)
*H01S 5/04* (2006.01)
(Continued)

(52) U.S. Cl.
CPC ............... *H01L 33/06* (2013.01); *H01S 5/0287* (2013.01); *H01S 5/041* (2013.01); *H01S 5/1203* (2013.01); *H01S 3/094092* (2013.01)

(58) Field of Classification Search
CPC . H01S 5/041; H01S 5/1203; H01S 3/094092; H01S 5/0287
USPC .......................... 372/72, 70, 71; 359/332, 328
See application file for complete search history.

(56) References Cited

U.S. PATENT DOCUMENTS 5,341,390 A 8/1994 Yamada et al.
2004/0061074 A1 4/2004 Chowdhury et al.
(Continued)

FOREIGN PATENT DOCUMENTS

DE 103 12 742 A1 6/2004

OTHER PUBLICATIONS

Tsang et al., "First Demonstration of Two Photon Absorption in a Semiconductor Waveguide Pumped by a Diode Laser", Electronics Letters, vol. 29, No. 18, pp. 1160-1161, Sep. 1993.

(Continued)

*Primary Examiner* — Tuan Nguyen
(74) *Attorney, Agent, or Firm* — Norris McLaughlin & Marcus P.A.

(57) ABSTRACT

An edge-emitting semiconductor component, comprising a semiconductor substrate layer and epitaxially on-grown semiconductor layers, is disclosed. According to the invention an active zone of the semiconductor layers is designed to absorb pumped optical radiation of a first wavelength by multi-photon absorption and generate an optical radiation of a second wavelength that is shorter than the first wavelength. A step of multiplying the first wavelength of the pumped optical radiation to a second harmonic using a nonlinear crystal is advantageously made redundant. Furthermore, a system for frequency conversion is disclosed, comprising the semiconductor component, a pump laser diode designed to generate the pumped optical radiation and methods for manufacturing the semiconductor component and operating the system for frequency conversion.

19 Claims, 3 Drawing Sheets

(51) Int. Cl.
*H01S 5/028* (2006.01)
*H01S 5/12* (2006.01)
*H01S 3/094* (2006.01)

(56) References Cited

U.S. PATENT DOCUMENTS

2004/0066823 A1    4/2004  Capasso et al.
2006/0279829 A1*  12/2006  Dohrman et al. ............. 359/241
2008/0151948 A1*   6/2008  Govorkov et al. ............. 372/22
2010/0202487 A1    8/2010  Sartorius et al.

OTHER PUBLICATIONS

Aitchison et al., "Role of Two-photon Absorption in Ultrafast Semiconductor Optical Switching Devices", Appl. Phys. Lett., vol. 56, No. 14, pp. 1305-1307, Apr. 1990.

Moro et al., "Stimulated Emission Induced by Two-Photon Absorption in a GaAs Quantum Wells", The American Physical Society, vol. 44, No. 15, Oct. 1991.

* cited by examiner

SYSTEM FOR FREQUENCY CONVERSION, SEMICONDUCTING DEVICE AND METHOD FOR OPERATING AND MANUFACTURING THE SAME

This invention relates to a system for frequency conversion, a semiconductor component, a method for operating a semiconductor component, and a method for manufacturing a semiconductor component.

PRIOR ART

Conventional semiconductor diodes include a highly doped p-n junction and produce photons in that primary photons stimulate electron-hole pairs for radiative recombination. The primary photons are amplified by the photons produced in this process, and the waves of the individual photons are in phase, that is, form a coherent wave train. It is known that more electrons and holes than exist in a state of equilibrium must be provided to operate a semiconductor laser. This state is also called population inversion. The photons pass a region in which population inversion exists multiple times, guided by a resonator, in order to produce laser radiation. This region is also called the active zone and is typically located between the p-type and n-type semiconductors.

Conventional semiconductor diodes in a wavelength range from about 390 nm to 480 nm typically consist of gallium nitride (GaN). GaN is generally a III-V semiconductor that comprises a relatively wide electronic bandgap of 3.37 eV due to its atoms, gallium from the main chemical group III and nitrogen from the main chemical group V. The wavelength λ of laser radiation that can be produced using a semiconductor diode is known to approximately correspond to $$\lambda = c \cdot \frac{h}{E_{gap}}$$

wherein c is the speed of light, h is Planck's constant, and $E_{gap}$ is the energy of the bandgap of the semiconductor.

Conventional long-wave GaN-based laser diodes emit at about 530 nm, short-wave ones at about 350 nm. The characteristics of the laser diodes are still insufficiently developed in both cases. Technological restrictions, such as a dominant series resistance due to low p-conductivity, limit the design of the waveguide structure and therefore the beam quality, even for commercially available wavelength ranges from 400 nm to 480 nm.

Semiconductor laser diodes cannot generate many wavelengths directly in the conventional manner; instead, these are generated, for example, by doubling the frequency of a primary laser radiation source using appropriate crystals. For increased efficiency, these crystals typically feature quasi-phase matching, e.g. periodically poled lithium niobate. Such a periodical polarization can also be achieved in GaN-based structures by combining metal polar and N-polar regions that are laterally arranged next to one another by two-step epitaxial growth. US 2004/0061074 describes such a GaN-based structure.

DE 103 12 742 A1 discloses a vertically emitting laser comprising an absorber layer for two-photon absorption. While such a vertically emitting laser has the advantage that the beam shape of the laser radiation emitted is determined by an external resonator, the arrangement according to FIG. 4 of DE 103 12 742 A1 only allows upward extraction of the laser radiation via the diameter of the beam determined by an external resonator, and the diameter has to be smaller than the component length. Upward extraction of the radiation is in addition competing with the unusable emission via facets 45 and 46.

US 2004/0066823 A1 discloses a laser structure that is both pumped electrically and thus generates an optical (pumped) radiation and comprises a nonlinear optical layer that is also located inside the resonator and implements a frequency conversion of the pump radiation without using optical couplers. Both the pumping source and the active layer are located in a common cavity. Since there currently are no semiconductor heterostructures for diode lasers that are still sufficiently transparent or do not absorb at about half the emission wavelength, the solution proposed in US 2004/0066823 A1 can only be used for (unipolar cascade) lasers that emit at very long wavelengths. Thus the laser structure of US 2004/0066823 A1 is not suitable for generating laser radiation in short-wave range that is difficult to access. Another disadvantage is that the pump laser diode and the frequency-converting component cannot be sufficiently optimized individually because of their monolithic integration in a common cavity.

U.S. Pat. No. 5,341,390 A discloses a vertically emitting apparatus designed for frequency doubling that is both electrically pumped and thus generates laser radiation and comprises a nonlinear optical layer located inside the resonator and implementing a frequency conversion of the laser light without using optical couplers, wherein the frequency conversion process is based on the symmetry of a zinc-blended lattice. This design cannot be directly applied to GaN-based structures that comprise a wurtzite lattice. Disadvantageously, this component is further based on generating the second harmonic and not on multi-photon absorption and subsequent independent radiative recombination in a quantum well. In addition, the component disclosed in U.S. Pat. No. 5,341,390 A has a large number of layers, which makes it complex and cost-intensive.

DISCLOSURE OF THE INVENTION

It is therefore the object of this invention to be able to produce laser radiation in a larger wavelength range and to achieve more flexibility in the design of waveguides and thus of the beam shape of a laser. It is another object of this invention to circumvent problems of doping, especially of p-doping in wide-bandgap semiconductors that have so far resulted in thickness limitations of semiconductor layers due to the associated electrical resistance.

According to the invention, this object is achieved by the subject matter of claim 1 or the independent claims, respectively, in particular, a semiconductor component is provided that includes a substrate and semiconductor layers that were epitaxially grown onto the substrate. The semiconductor layers include an active zone and a waveguide layer. According to the invention, the active zone is designed to absorb pumped optical radiation of a first wavelength by multi-photon absorption and to generate an optical radiation of a second wavelength that is shorter than the first wavelength.

The frequency conversion system according to the invention comprises the semiconductor component and a pump laser diode that generates the pumped optical radiation of the first wavelength.

The method according to the invention for operating a semiconductor component with a semiconductor substrate and semiconductor layers that were epitaxially grown onto the substrate, said layers comprising an active zone and a waveguide layer, includes the following steps:

Optical pumping of the active zone by pump radiation of a first wavelength,

Absorption of the pump radiation in the active zone through multi-proton absorption, and Generation of optical radiation of a second wavelength that is shorter than the first wavelength.

It is preferred that the pump radiation in the active zone is only absorbed by multi-proton absorption.

The method for manufacturing a semiconductor component for frequency conversion substantially includes the following steps:

Provision of a semiconductor substrate layer that is grown onto a substrate;

Epitaxial growing of a first waveguide layer onto the semiconductor substrate layer;

Epitaxial growing of an active zone onto the first waveguide layer, wherein the active zone includes at least one first quantum well;

Epitaxial growing of a second waveguide layer onto the active layer;

Optical radiation is part of the electromagnetic spectrum and preferably includes ultraviolet radiation, light visible to humans, and infrared radiation. In particular, optical radiation includes laser radiation, that is, substantially coherent optical radiation.

The semiconductor element according to the invention allows waveguiding parallel to the substrate, i.e. guidance of the pumped optical radiation and the optical radiation of the second wavelength. Waveguiding can be adjusted flexibly by epitaxial growth of the semiconductor layers. Lateral waveguiding can be achieved by lateral structuring of the semiconductor layers or by depositing of other structured layers.

Epitaxy is generally a form of crystal growth by which the semiconductor layer can be grown onto the—preferably crystalline—semiconductor substrate. Epitaxy substantially designates the case in which a crystallographic orientation of the grown semiconductor layer matches an orientation of the crystalline semiconductor substrate or a semiconductor layer underneath it. One advantage of epitaxially grown semiconductor layers is that electrooptical properties can be achieved by combining layers of different compositions (heterostructures) that could not be achieved with conventional crystals of just one composition. Epitaxy can also allow more abrupt transitions of doping agent concentrations than would be possible to achieve, for example, using conventional diffusion or ion implantation methods. Epitaxy also allows the use of buried structures for lateral waveguiding and thus a more flexible design of component structures.

The semiconductor component according to the invention also provides for advantageous frequency conversion through multi-photon absorption without multiplying the first wavelength or the respective first frequency of the pumped optical radiation to the second harmonic, using known nonlinear crystals such as lithium niobate, $LiNbO_3$, potassium hydrogen phosphate, KDP, beta barium borate, BBO. If a conventional crystal is pumped at high intensity, it will generate optical radiation at multiples of the first frequency due to nonlinearities, and it is difficult to achieve a stable output or mode. The known structures with quasi-phase alignment also used at higher outputs often show large parameter scattering so that the component temperature needs to be regulated precisely and individually for the respective component. This effort is not required for the semiconductor component according to the invention, while at the same time the optical radiation generated comprises better output and mode stability.

Multi-photon absorption typically designates the simultaneous absorption of multiple photons by a molecule or an atom that will change to an excited state in the process. The particular advantage of multi-photon absorption is the generation of coherent radiation at a real multiple of the first frequency of the pump radiation. The semiconductor component according to the invention can thus convert the optical pump radiation with the first wavelength or the respective first frequency into the optical radiation with the second wavelength or the respective second frequency, wherein the second wavelength is shorter than the first wavelength or the second frequency is higher than the first frequency, respectively. The semiconductor component can in particular generate optical radiation with a second wavelength from 630 nm to 220 nm or to 210 nm.

It is preferred that the semiconductor component according to the invention is designed as an edge-emitting component, particularly preferably as an edge-emitting semiconductor laser. The term "edge-emitting component" in the meaning of this invention is a component that emits radiation via an edge of the active layer (or active zone) that extends laterally relative to the layers. The radiation is thus not emitted (extracted) vertically via the top or bottom side of the layer system (that is, it does no pass through the waveguide layer). It is preferred that the semiconductor component according to the invention comprises a lateral input facet (hereinafter also called entrance facet) and lateral output facet (hereinafter also called exit facet), which in combination with the waveguide layers are suitable, first, for implementing the waveguiding for the emitted laser radiation in the plane of the semiconductor layer structure, and second, for forming a longitudinal resonator (i.e. extending parallel to the layers) for the laser radiation. This provides for the (preferred) integration of grating structures, wherein the webs of the grating extend along the longitudinal axis of the resonator, that is, between the entrance and exit facets of the semiconductor component.

It is preferred that the semiconductor component according to the invention is designed such that the waveguide layers provide collinear conduction of the pump radiation and the laser radiation generated, wherein, on the one hand, the semiconductor component provides for efficient absorption of the pump radiation even at low absorption coefficients that are typical of multi-photon processes underneath the band edge region, and, on the other hand, laser radiation is generated at the second, shorter wavelength across the entire extension of the component (the active layer or active zone). This has the advantage that materials can be used for the active layer, which, while having a relatively low absorption coefficient with respect to the pump radiation, still provide for successful absorption of the pump radiation because the cavity extends across (almost) the entire length of the cavity and because of the high reflectivity of the elements that form the cavity (facets, lattices) with respect to the pump radiation. It is therefore possible to design the active zone such that the absorption coefficient is smaller than 100 $cm^{-1}$, more preferably smaller than 10 $cm^{-1}$.

According to the invention, this laser radiation can be extracted via the exit facet. It is preferred that at least the exit facet is (largely) transparent for the laser radiation generated. Many common materials for deposits either do not meet this requirement for the desired emission wavelengths in combination with the requirement of high reflectivity for the pump wavelength, or meet it to a very limited extent only. In such a case it is preferable that one can largely control the reflectivity for the pump radiation (pump wavelength) and the laser radiation (emission wavelength) independently by integrating at least one lattice.

With respect to the laser radiation, it is preferred that the entrance facet is deposited with a dielectric layer package that provides it with higher reflectivity than the exit facet. Particularly preferred are single-layer deposits of the entrance facet and/or the exit facet. Absorption of the laser radiation is preferably negligible in these layers.

The entrance facet preferably has a reflectivity for the pump radiation that is smaller than 0.1, more preferably smaller than 0.05, and even more preferably smaller than 0.01. The entrance facet preferably has a reflectivity for the laser radiation that is greater than 0.7, more preferably greater than 0.9, and even more preferably greater than 0.95.

The exit facet preferably has a reflectivity for the laser radiation that is between 0.01 and 0.2, more preferably between 0.02 and 0.15, and even more preferably between 0.03 and 0.1. The exit facet preferably has a reflectivity for the pump radiation that is greater than 0.5, more preferably greater than 0.7, and even more preferably greater than 0.9.

It is preferred that a grating reflecting the laser radiation is integrated in the region of the entrance facet. This grating preferably extends across just 50%, more preferably across just 30%, and even more preferably across just 15% of the extension between the entrance and the exit facet.

It is preferred that a grating reflecting the pump radiation is integrated in the region of the entrance facet. This grating preferably extends across just 50%, more preferably across just 30%, and even more preferably across just 15% of the extension between the entrance and the exit facet.

The entrance facet and the exit facet are preferably located at the lateral (side) areas of the semiconductor element only. The entrance and exit facets are opposite one another in relation to the active zone. The entrance facet and the exit facet are preferably in direct contact with the lateral areas (edges) of the active zone.

It is preferred that the active layer (active zone) extends across the entire space between the entrance facet and the exit facet. The active layer (active zone) preferably has a uniform composition and layer thickness between the entrance facet and the exit facet. The active zone (active layer) preferably designed as a strip. The active layer (active zone) preferably has a uniform width between the entrance facet and the exit facet.

It is further preferred that the semiconductor component according to the invention is exclusively pumped optically. It is therefore preferred that the waveguide layers are in direct contact with the active zone across the entire length between entrance facet and exit facet, so that there are no (additional) electrodes provided between the active zone and the waveguide layers. It is further preferred that the waveguide layer located nearest to the semiconductor substrate layer is in direct contact with the semiconductor substrate layer and the active zone across the entire length between the entrance facet and the exit facet, so that there is no (additional) electrode provided between the the waveguide layer and the semiconductor substrate layer. It is therefore preferred that the semiconductor element according to the invention does not comprise any electrodes (or other means) for injecting charge carriers into the active layer (active zone). It is therefore preferred that the semiconductor element according to the invention does not comprise any other (nonlinear) emitting optical layers (which optionally emit radiation at another wavelength than the active zone) between the waveguide layers.

The active zone may preferably include a quantum well surrounded by barriers and optional spacer layers between the quantum well and the barriers, wherein the barriers and the spacer layers have a greater bandgap than the quantum well. The barriers and spacer layers may preferably be epitaxially grown semiconductor layers.

A quantum well, also called quantum film, substantially designates a potential curve that limits the freedom of movement of an electron in a spatial dimension. The thickness of the quantum well preferably determines the quantum-mechanical states that the electron can enter into. The quantum well is preferably surrounded by a semiconductor heterostructure, such as spacer layers and/or barriers.

Furthermore, the at least one quantum well can advantageously be designed such that it can absorb half the wavelength or one third of the wavelength or one quarter of the first wavelength of the pump radiation.

The optical pump radiation of the first wavelength or the photons of the pump laser diode are absorbed by multi-photon absorption, especially in the quantum well; in this way, optical radiation of the second wavelength that is shorter than the first wavelength can be generated. The second wavelength can generally be set as an x multiple of the first wavelength, for example by means of the layer thickness of the quantum well, x being a positive real number greater than two. Conventional frequency multiplications using nonlinear crystals would only provide for integral frequency multiples.

In a preferred further development, the active zone may comprise multiple quantum wells. Preferably, a barrier that can absorb half the wavelength of the first wavelength of the pump radiation is provided between two quantum wells.

The active zone may preferably comprise two spacer layers between which the multiple quantum wells and the barriers surrounding the quantum wells are located. The quantum wells are preferably made of AlGaN or AlGaIn. The barriers are preferably also made of AlGaN or AlGaIn (with a higher Al content).

The active zone and/or at least one of the waveguide layers preferably comprise a semiconducting material with a wurtzite structure.

The waveguide layer may preferably include multiple layers that comprise (Al, Ga, In)N. (Al, Ga, In)N, where Al stands for aluminum, Ga for gallium, In for indium, and N for nitrogen (or called nitrides in chemical compounds), substantially is a quaternary solid solution. This solid solution may, for example, act as a barrier or waveguide for the optical radiation generated in the range from 630 nm to 220 nm. (Al, Ga, In)N generally belongs to the III-V compound semiconductors that can be advantageously suited for wavelengths in the ultraviolet range, such as for wavelengths smaller than 380 nm.

In another advantageous embodiment, the waveguide layer may include multiple layers comprising (Be, Mg, Zn, Cd)O or (Be, Mg, Zn, Cd)(Se, S), where Be stands for beryllium, Mg for magnesium, Zn for zinc, Cd for cadmium, O for oxygen, Se for selenium, and S for sulfur. The (Be, Mg, Zn, Cd)O or (Be, Mg, Zn, Cd)(Se, S) solid solution generally belongs to the II-VI compound semiconductors, which due to their wide bandgap may be particularly well suited for semiconductor laser applications in the spectral range of shorter wavelengths, such as 630 nm to 220 nm for optical radiation. II-VI compound semiconductors can in particular be produced by epitaxial growth.

The waveguide layer may preferably be designed for guiding the pumped optical radiation and the generated optical radiation.

It is further preferred that divided and coated facets and/or a grating structure may form a resonator (cavity) for the generated optical radiation with the second wavelength.

In particular, the active zone may comprise a grating structure designed to reflect the second wavelength of the generated optical radiation. It is advantageously located near the entrance facet.

Preferably, the active zone comprises a grating structure designed to reflect the first wavelength of the pumped optical radiation. It is advantageously located near the exit facet.

In a preferred embodiment, the active zone may comprise a cavity that is bounded by facets or by a grating structure or a combination thereof. The facets are preferably broken and coated. The cavity preferably comprises a resonance frequency that can cause a resonance peak of the pump radiation. For example, the facets or grating structure act as a mirror for the pump radiation and may contribute to reflecting its photons. In particular, the facets and/or the grating structure introduced comprise reflectivity that is sufficient for the optical radiation generated in the quantum well or wells to enable laser activity at the wavelength of the generated optical radiation.

The second wavelength of the semiconductor component according to the invention preferably includes a range from 220 to 630 nm. The second wavelength can be easily set using the epitaxially grown semiconductor layers.

The system according to the invention allows a compact design for semiconductor lasers for generating optical radiation or laser radiation in the range from 630 nm to 220 nm. The material of the active zone of the semiconductor component according to the invention is particularly preferred as a suitable material for emitting optical radiation at a wavelength smaller than 350 nm.

It is preferred that the semiconductor component and the pump laser diode are arranged relative to one another such that collinear conduction of the pump radiation and the laser radiation is implemented, which provides for efficient absorption of the pump radiation even at low absorption coefficients that are typical of multi-photon processes underneath the band edge region, and for generation of laser radiation at the second, shorter wavelength across the entire extension of the component (i.e. the entire extension of the active zone between the facets). The pump laser diode is preferably designed as an edge-emitting laser diode. It is preferred that the semiconductor component according to the invention and the pump laser diode are placed near one another. However, the pump laser diode is not in direct contact with the entrance facet of the semiconductor component. It is instead preferred that a gap in the range from 0.5 μm to 20 μm is provided between the exit facet of the pump laser diode and the entrance facet of the semiconductor component. In yet another advantageous embodiment, the radiation of the pump laser diode is mapped using an imaging optic, advantageously a GRIN lens, onto the entrance facet of the semiconductor element. This increases the effort to produce the system but also its flexibility.

The first wavelength of the pump laser diode does not necessarily have to be in an even-numbered relationship to the generated second wavelength, as is the case in conventional frequency doubling. Instead, the system according to the invention provides for advantageous use of economically producible, efficient pump laser diodes of other wavelengths that may, for example, be in a real relationship of equal to or greater than two to the generated second wavelength.

The pump laser diode preferably includes the semiconducting material GaAs and can generate pumped optical radiation of the first wavelength between 625 nm and 1300 nm. GaAs stands for gallium arsenide.

In an advantageous embodiment, the pump laser diode can include the semiconducting material GaN and generate pumped optical radiation at the first wavelength between 380 nm and 550 nm. GaN stands for gallium nitride.

In another advantageous embodiment, the pump laser diode can include the semiconducting material InP and generate pumped optical radiation at the first wavelength between 1250 nm and 1800 nm. InP stands for indium phosphide.

The semiconductor component preferably comprises an internal resonator formed by the facets and/or integrated gratings, which means that no external resonator is required for laser operation.

Epitaxial growth of the active zone of the semiconductor component may preferably comprise the following steps:
Forming a first spacer layer;
Forming a first quantum well on the first spacer layer;
Forming a barrier on the first quantum well;
Forming a second quantum well on the barrier;
Forming a second spacer layer on the second quantum well.

The method according to the invention for manufacturing a semiconductor component may preferably further include the following step: Forming a grating in the active zone starting from the surface of the active zone, wherein the grating is produced by a two-step epitaxial process within the active zone. Alternatively, a grating can be inserted into one of the waveguide layers, which is buried in a two-step epitaxial process in material with another composition and another refractive index.

Furthermore, a grating can be formed in one of the waveguide layers, wherein the grating can be produced after epitaxy by etching a surface of one of the waveguide layers within the waveguide layer and/or the active zone. This embodiment is particularly advantageous, since no second epitaxial process is required.

BRIEF DESCRIPTION OF THE DRAWINGS

Embodiments of the invention are explained in greater detail with reference to the drawings and the description below. Wherein.

DETAILED DESCRIPTION OF THE DRAWINGS

Figure 1:
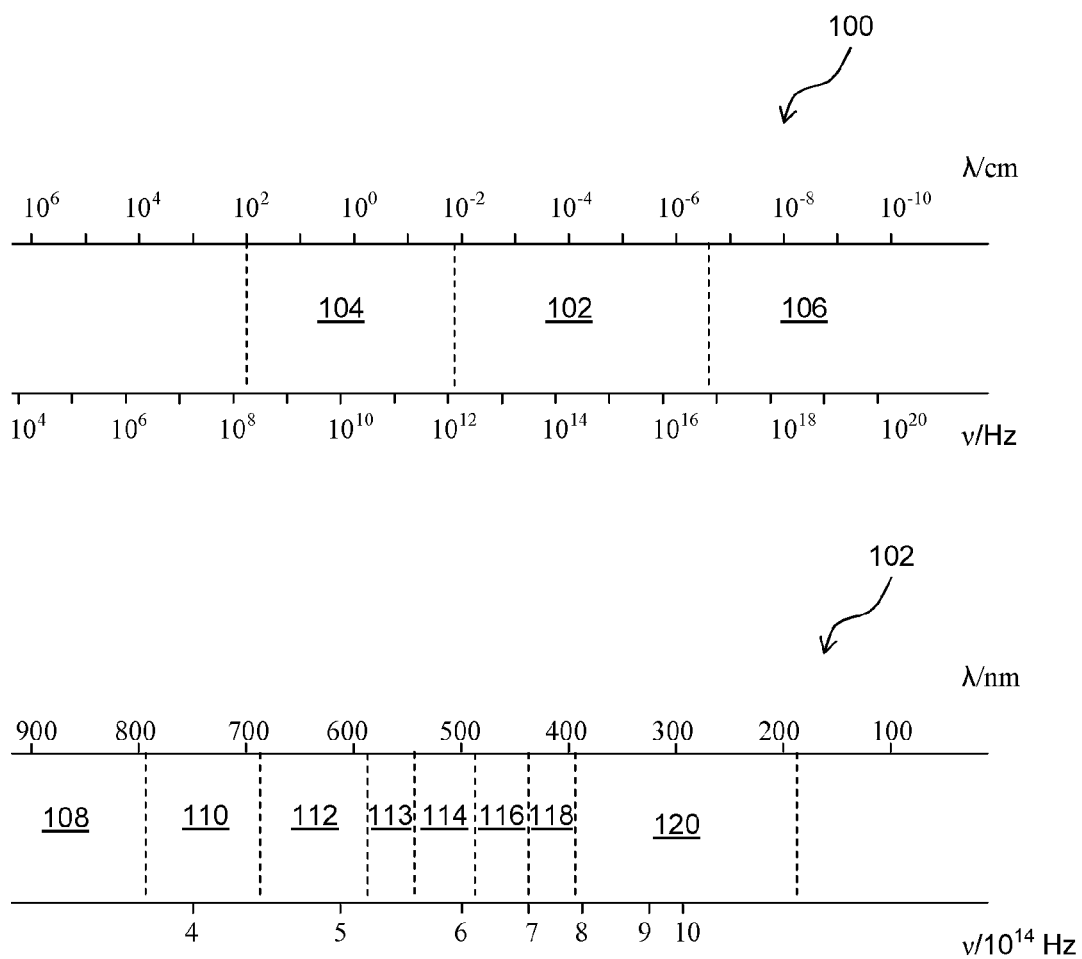
FIG. 1 shows a diagram of an electromagnetic spectrum.

FIG. 1 shows a diagram of an electromagnetic spectrum 100. The upper scale of the diagram indicates the wavelength λ in cm. The lower scale of the diagram indicates the corresponding frequency ν in Hz. An enlarged excerpt from the electromagnetic spectrum 100 in particular shows a region 102 for optical radiation. The region 102 for optical radiation is located between the region 104 for radar and microwaves and the region 106 for X-radiation. The region 102 for optical radiation comprises an upper scale for the wavelength λ in nm and a lower scale for the corresponding frequency ν in $10^{14}$ Hz. The region 102 is divided as follows from long-wave to short-wave: a region 108 for infrared radiation, especially near infrared radiation, a region 110 for red visible light, a region 112 for orange visible light, a region 113 for yellow visible light, a region 114 for green visible light, a region 116 blue visible light, a region 118 for violet visible light, and a region 120 for near ultraviolet radiation.

Figure 2:
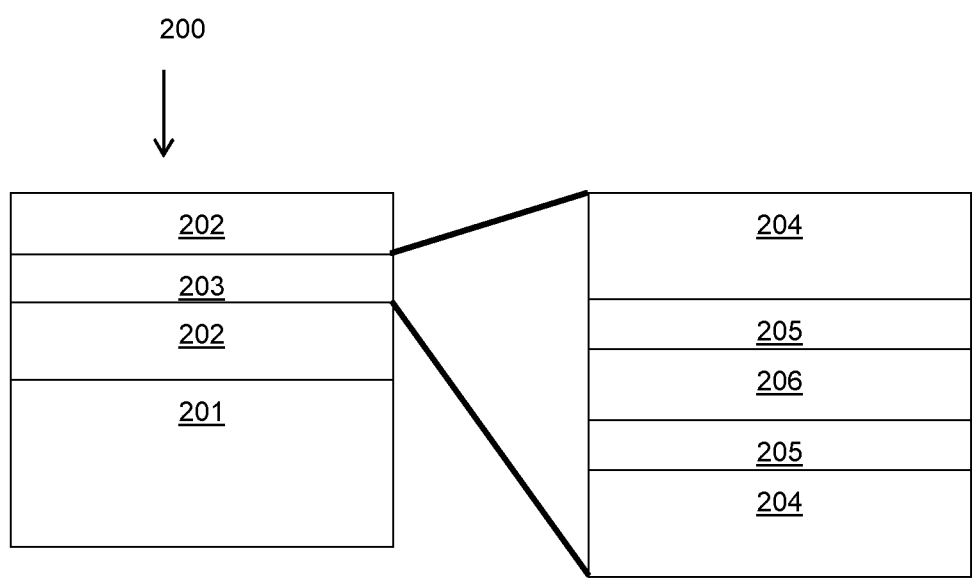
FIG. 2 shows a semiconductor component according to the invention.

FIG. 2 shows a schematic view of a semiconductor component 200 that comprises a semiconductor substrate layer 201 onto which multiple semiconductor layers are epitaxially grown, namely a first waveguide layer 202, an active zone 203, and a second waveguide layer 202. An enlarged view of the active zone 203 is shown next to the semiconductor component 200 shown in the Figure. The active zone 203 includes a first spacer layer 204 on which a first quantum well 205, a barrier 206, a second quantum well 205, and a second spacer layer 204 are formed one after the other. The first and second waveguide layers 202 supply pumped optical radiation of a first wavelength from a semiconductor diode (not shown) to the active zone 203. The barrier 206 and the spacer layers 204 have a wider bandgap than the quantum wells 205. The spacer layers 204 have a wider bandgap than the barrier 206 but a smaller bandgap than the respective adjacent waveguide layer 202. Such an arrangement makes it possible to enclose the charge carriers produced by multi-photon absorption in the quantum wells 205 and optionally the barrier 206 and to make them available for stimulated emission at the second wavelength.

In an exemplary embodiment, the quantum wells 205 are made of $Al_xGa_{1-x}N$ with an Al content of about x=0.1 and a thickness of 2 nm, and they emit at about 340 nm. The barrier 206 is an $Al_xGa_{1-x}N$ structure about 10 nm thick and with an Al content of about x=0.13 that absorbs at 330 nm. The spacer layers 204 have a higher Al content of x=0.2 and are transparent above 310 nm. The surrounding waveguide layers 202 are dimensioned such that they act as waveguides and ensure waveguiding for both the generated second radiation of 340 nm and the pump radiation at a wavelength in the range from 660 nm and 640 nm. If this arrangement with a pump radiation in the range from 660 nm to 640 nm is pumped through a divided facet, it can be absorbed in the barrier and the quantum wells through two-photon absorption. The generated electron-hole pairs are localized between the spacer layers and can then generate the second radiation at a wavelength of about 340 nm. This radiation can be stimulated and emitted as laser radiation with suitable feedback.

Figure 3:
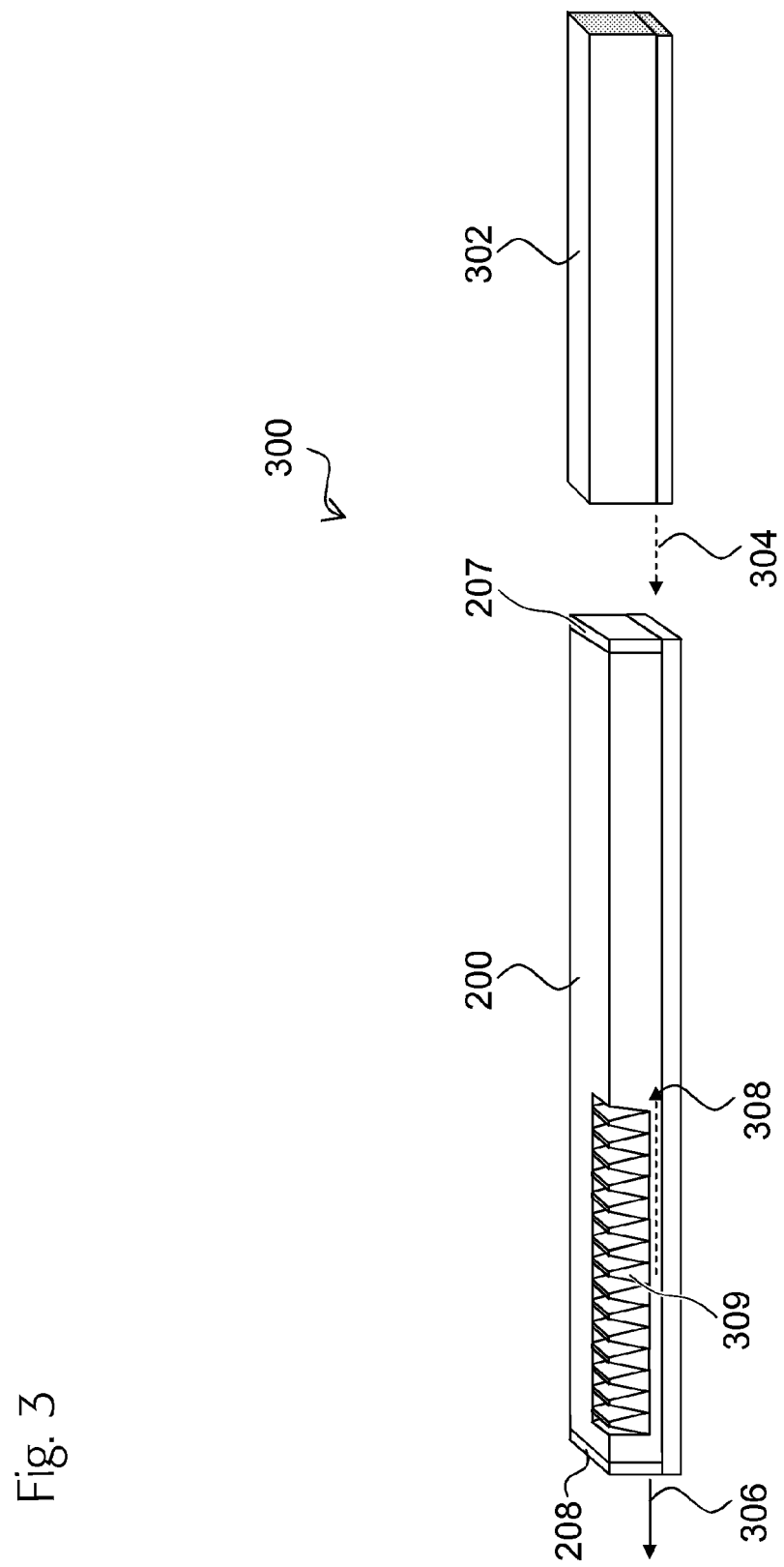
FIG. 3 shows a system for frequency conversion according to the invention.

FIG. 3 shows an embodiment of the system 300 for frequency conversion according to the invention. The system 300 comprises a semiconductor diode 302 that generates a pump radiation 304 at a first wavelength in the range between 640 nm and 660 nm. The semiconductor diode 302 emits the pump radiation onto the end face of the semiconductor component 200 such that it can be conducted in the waveguide. FIG. 3 shows a perpendicular impact, but other angles are conceivable.

The photons of the pump radiation 304 are absorbed by multi-photon absorption in the quantum wells 205. The absorption generates optical radiation 306 of a second wavelength of about 340 nm that is shorter than the first wavelength.

Furthermore, a grating structure 309 that acts as a mirror for the pump radiation 304 and causes a reflected pump radiation 308 is formed in the active zone. This improves the conversion of the pump radiation into optical radiation 306 and reduces the emission of pump radiation 304 from the exit facet 208.

If the grating is configured appropriately, it simultaneously acts as a reflector of the optical radiation of shorter wavelengths 306 so that it forms a resonator for this radiation together with the entrance facet 207. In addition, the active zone may comprise another grating structure (not shown here) that is designed to reflect the second wavelength of the generated optical radiation 306. While the grating structure 309 that is designed to reflect the pump radiation 304 is preferably located in the region of the exit facet 208, this other grating structure is preferably located (at a spacing from the grating structure 309) in the region of the entrance facet 207.

The semiconductor component 200 thus acts as a frequency converter and generates optical radiation 306 of the second wavelength, which may generally be located in the regions 112, 113, 114, 116, 118, and 120, that is, from visible orange light to the near ultraviolet range, or from 630 nm to 210 nm.

LIST OF REFERENCE SYMBOLS

100 Electromagnetic spectrum
102 Region for optical radiation
104 Region for radar and microwaves
106 Region for X-radiation
108 Region for infrared radiation
110 Region for red visible light
112 Region for orange visible light
113 Region for yellow visible light
114 Region for green visible light
116 Region for blue visible light
118 Region for violet visible light
120 Region for near ultraviolet radiation
200 Semiconductor component
201 Semiconductor substrate
202 Waveguide layer
203 Active zone
204 Spacer layer
205 Quantum well
206 Barrier
207 Entrance facet
208 Exit facet
300 System for frequency conversion
302 Semiconductor diode
304 Pump radiation
306 Optical radiation of the second waveguide
308 Reflected pump radiation
309 Grating structure for reflecting the pump radiation

The invention claimed is:

1. A system for frequency conversion, comprising a pump laser diode and an edge-emitting semiconductor component with the pump laser diode designed to generate pumped optical radiation of a first wavelength and provided at a spacing of the edge-emitting semiconductor component that comprises:
   a semiconductor substrate layer and
   semiconductor layers epitaxially grown onto the semiconductor substrate layer which include an active zone and a waveguide layer, wherein an entrance facet and an exit facet are laterally located with respect to the active zone,
   wherein the active zone is designed to absorb pumped optical radiation of a first wavelength by multi-photon absorption and to generate an optical radiation of a second wavelength that is shorter than the first wavelength, without multiplying the first wavelength of the pumped optical radiation to a second harmonic using a nonlinear crystal,
   characterized in that the active zone comprises a cavity, said cavity comprising a resonant frequency that causes a resonance peak of the optical radiation.

2. The system according to claim 1, wherein the active zone comprises at least one quantum well surrounded by barriers, said barriers having a wider bandgap than the quantum well.

3. The system according to claim 2, wherein the at least one quantum well is designed such that it can absorb half the wavelength or one third of the wavelength or one quarter of the first wavelength of the pump radiation.

4. The system according to claim 1, wherein the active zone comprises at least two spacer layers between which the multiple quantum wells and barriers surrounding the quantum wells are located.

5. The system according to claim 1, wherein the waveguide layer includes multiple layers that comprise (Al, Ga, In)N, (Be, Mg, Zn, Cd)O, or (Be, Mg, Zn, Cd)(Se, S).

6. The system according claim 1, wherein the active zone comprises a first grating structure that is located between the entrance facet and the exit facet and designed to reflect the second wavelength of the generated optical radiation.

7. The system according to claim 6, wherein the entrance and exit facets are broken and coated.

8. The system according to claim 1, wherein the active zone comprises a second grating structure that is located between the entrance facet and the exit facet and designed to reflect the first wavelength of the pump radiation.

9. The system according to claim 8, wherein the first grating structure and the second grating structure are located at a spacing from one another in the cavity.

10. The system according to claim 8, wherein the entrance and exit facets are broken and coated.

11. The system according to claim 1, wherein the cavity is at least bounded by one of the entrance facet and the exit facet or by at least one grating structure or a combination thereof.

12. The system according to claim 11, wherein the entrance and exit facets are broken and coated.

13. The system according to claim 1, wherein the entrance and exit facets are broken and coated.

14. The system according to claim 1, wherein the second wavelength includes a range from 210 nm to 630 nm.

15. The system according to claim 1, wherein the semiconductor component and the pump laser diode are arranged relative to one another such that collinear guidance of the pump radiation and the generated laser radiation is achieved.

16. The system according to claim 1, wherein the pump laser diode is designed as an edge-emitting component.

17. The system according to claim 1, wherein the pump laser diode comprises the semiconducting material GaAs and generates the pumped optical radiation at the first wavelength between 625 nm and 1300 nm.

18. The system according to claim 1, wherein the pump laser diode comprises the semiconducting material GaN and generates the pumped optical radiation at the first wavelength between 380 nm and 550 nm.

19. The system according to claim 1, wherein the pump laser diode comprises the semiconducting material InP and generates the pumped optical radiation at the first wavelength between 1250 nm and 1800 nm.

* * * * *